(12) United States Patent
Schumacher et al.

(10) Patent No.: US 7,917,876 B1
(45) Date of Patent: Mar. 29, 2011

(54) METHOD AND APPARATUS FOR DESIGNING AN EMBEDDED SYSTEM FOR A PROGRAMMABLE LOGIC DEVICE

(75) Inventors: Paul R. Schumacher, Berthoud, CO (US); Daniel L McMurtrey, Albuquerque, NM (US); Shengqi Yang, Chandler, AZ (US)

(73) Assignee: Xilinx, Inc., San Jose, CA (US)

( * ) Notice: Subject to any disclaimer, the term of this patent is extended or adjusted under 35 U.S.C. 154(b) by 149 days.

(21) Appl. No.: 11/729,206

(22) Filed: Mar. 27, 2007

(51) Int. Cl.
*G06F 17/50* (2006.01)

(52) U.S. Cl. ........................................ 716/116; 716/117

(58) Field of Classification Search .................. 716/1, 3, 716/16–18, 116, 117
See application file for complete search history.

(56) References Cited

U.S. PATENT DOCUMENTS

| | | | |
|---|---|---|---|
| 5,392,429 | A | 2/1995 | Agrawal et al. |
| 5,815,003 | A | 9/1998 | Pedersen |
| 5,991,194 | A | 11/1999 | Jigour et al. |
| 6,230,307 | B1 * | 5/2001 | Davis et al. ...................... 716/16 |
| 6,236,229 | B1 | 5/2001 | Or-Bach |
| 6,366,998 | B1 | 4/2002 | Mohamed |
| 6,643,764 | B1 | 11/2003 | Thorson et al. |
| 7,228,520 | B1 * | 6/2007 | Keller et al. ...................... 716/17 |
| 7,432,734 | B2 | 10/2008 | Lewis et al. |
| 7,441,099 | B2 | 10/2008 | Lo et al. |
| 7,526,632 | B1 | 4/2009 | Rupp et al. |
| 7,631,284 | B1 * | 12/2009 | Perry et al. ...................... 716/16 |
| 2005/0055462 | A1 | 3/2005 | Imming et al. |
| 2006/0015674 | A1 * | 1/2006 | Murotake ..................... 711/101 |
| 2008/0082797 | A1 | 4/2008 | Lo et al. |
| 2008/0244238 | A1 | 10/2008 | Mitu |

OTHER PUBLICATIONS

Neuendorffer, Stephen A., et al., "Interface Generation for Coupling to a High-Bandwidth Interface", U.S. Appl. No. 11/405,898, filed Apr. 18, 2006, 46 pages, available from Xilinx, Inc., 2100 Logic Drive, San Jose, CA 95124.
Turney, Robert D. et al, "Method and Apparatus for Communication Between a Processor and Hardware Blocks in a Programmable Logic Device" U.S. Appl. No. 11/076,798, filed Mar. 10, 2005, 34 pages, available from Xilinx, Inc., 2100 Logic Drive, San Jose, CA 95124.
Schumacher, Paul R. et al, "Method and Apparatus for Communication Between a Processor and Hardware Blocks" U.S. Appl. No. 11/076,797, filed Mar. 10, 2005, 34 pages, available from Xilinx, Inc., 2100 Logic Drive, San Jose, CA 95124.
Wei, Wen Ying et al., "Parameterizable LocalLink FIFO", Xilinx Application Note XAPP691, Feb. 2, 2004, pp. 1-30, v1.0, available from Xilinx, Inc., 2100 Logic Drive, San Jose, CA 95124.
U.S. Appl. No. 11/729,182, filed Mar. 27, 2007, Schumacher, Paul R. et al.; "Method and Apparatus for Communication Between a Processor and Processing Elements in a Programmanle Logic Device", 41 pages, available from Xilinx, Inc., 2100 Logic Drive, San Jose, CA 95124.

* cited by examiner

*Primary Examiner* — Vuthe Siek
(74) *Attorney, Agent, or Firm* — Robert M. Brush; LeRoy D. Maunu

(57) ABSTRACT

Method and apparatus for designing an embedded system for a programmable logic device (PLD) is described. Parameters specific to the embedded system are obtained. Source code files that use the parameters to define configurable attributes of the base platform are generated. A software definition and a hardware definition are obtained. The software and hardware definitions each use an application programming interface (API) of the base platform to define communication between software and hardware of the embedded system. An implementation of the embedded system is automatically built for the PLD using the source code files, the software definition, and the hardware definition.

20 Claims, 11 Drawing Sheets

| WORD | DESCRIPTION | | | | | | | |
|---|---|---|---|---|---|---|---|---|
| | 31:28 | 27:24 | 23:20 | 19:16 | 15:12 | 11:8 | 7:4 | 3:0 |
| 0 | PRIORITY | INSTRUCTION | | | PACKET LENGTH | | | |
| 1 | DATA WORD 0 | | | | | | | |
| 2 | DATA WORD 1 | | | | | | | |
| 3 | DATA WORD 2 | | | | | | | |

FIG. 2

| | 604-1 | | | | | | | 604-8 |
|---|---|---|---|---|---|---|---|---|
| 602-0 INST 0 | SLOT WITH FASTEST RUN TIME | SLOT WITH 2ND FASTEST RUN TIME | SLOT WITH 3RD FASTEST RUN TIME | SLOT WITH 4TH FASTEST RUN TIME | SLOT WITH 5TH FASTEST RUN TIME | SLOT WITH 6TH FASTEST RUN TIME | SLOT WITH 7TH FASTEST RUN TIME | SLOT WITH 8TH FASTEST RUN TIME |
| INST 1 | | | | | | | | |
| 602-1 ... | ... | ... | ... | ... | ... | ... | ... | ... |
| 602-N-1 INST N-1 | | | | | | | | |

METHOD AND APPARATUS FOR DESIGNING AN EMBEDDED SYSTEM FOR A PROGRAMMABLE LOGIC DEVICE

FIELD OF THE INVENTION

One or more aspects of the invention relate to programmable logic devices (PLDs) and, more particularly, to a method and apparatus for designing an embedded system for a (PLD).

BACKGROUND

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

Traditional complex processing systems are typically implemented using software running on a microprocessor in conjunction with multiple dedicated hardware blocks and thus are suitable for implementation using a PLD. In such systems, hardware blocks are used to perform complex-functions more efficiently than performing such functions in software. Supporting mixed hardware/software processing systems with an appropriate hardware/software platform is desirable. Communication between the software portion of the system (i.e., software running on a processor) and the hardware portion of the system should be efficient. It is further desirable to encapsulate platform-dependent aspects of communication between the software and hardware portions of the system in order to provide an efficient programming interface. It is further desirable to provide an automated design tool to map hardware/software systems onto a hardware/software platform in a PLD.

SUMMARY

An aspect of the invention relates to an apparatus for communication between processing elements and a processor in a programmable logic device (PLD). A first lookup table is configured to store first information representing which of the processing elements is capable of performing which of a plurality of instructions. In an embodiment, the first lookup table is also configured to store a measure of the relative speed in which each processing element can perform each of its respective instructions. A second lookup table is configured to store second information representing which of the plurality of instructions is being serviced by which of the processing elements. Control logic is coupled to the processor, the first lookup table, and the second lookup table. The control logic is configured to communicate data from the processor to the processing elements based on the first information, and communicate data from the processing elements to the processor based on the second information.

Another aspect of the invention relates to a method of communication between processing elements and a processor in a PLD. A first packet is received from the processor. The first packet comprising a header and a data block. The header includes an outstanding instruction of a plurality of instructions to be performed. At least one of the processing elements is selected to service the outstanding instruction to be performed based on first information. The first information represents which of the processing elements is capable of performing which of the plurality of instructions. The first packet is provided to the selected at least one processing element. Second information is updated based on the selected at least one processing element servicing the outstanding instruction to be performed. The second information represents which of the plurality of instructions is being serviced by which of the processing elements. In an embodiment, a second packet is received from the processor. The second packet comprises a header including an outstanding instruction of the plurality of instructions for which data is to be read. Data is read from a selected one of the processing elements that serviced the outstanding instruction for which data is to be read based on the second information. The second information is updated based on the selected one of the processing elements.

Another aspect of the invention relates to a method, apparatus, and computer readable medium for designing an embedded system for a PLD. Parameters specific to the embedded system are obtained. Source code files that use the parameters to define configurable attributes of the base platform are generated. A software definition and a hardware definition are obtained. The software and hardware definitions each use an application programming interface (API) of the base platform to define communication between software and hardware of the embedded system. An implementation of the embedded system is automatically built for the PLD using the source code files, the software definition, and the hardware definition.

BRIEF DESCRIPTION OF THE DRAWINGS

The accompanying drawings show exemplary embodiments in accordance with one or more aspects of the invention. However, the accompanying drawings should not be taken to limit the invention to the embodiments shown, but are for explanation and understanding only.

FIG. 2 is a block diagram depicting an exemplary embodiment of a packet format for an instruction in accordance with one or more aspects of the invention;

FIG. 6 is a block diagram depicting an exemplary embodiment of a table representative of data stored in a priority lookup table of the platform interface in accordance with one or more aspects of the invention;

DETAILED DESCRIPTION

Figure 1:
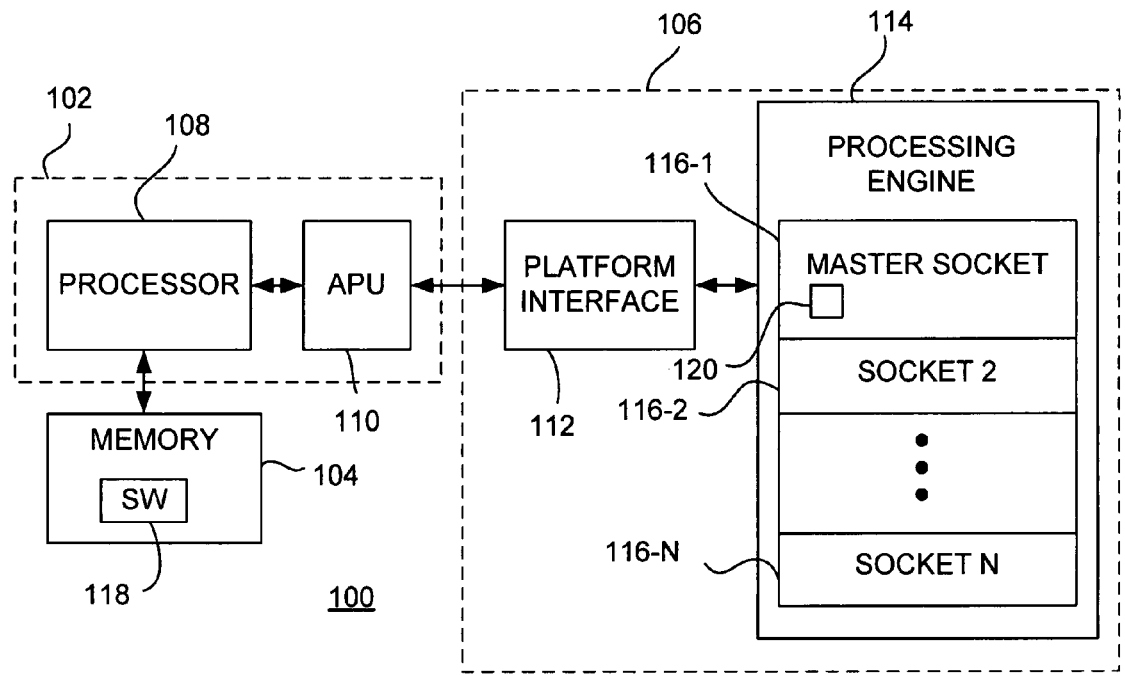
FIG. 1 is a block diagram depicting an exemplary embodiment of an embedded processing system in accordance with one or more aspects of the invention.
Figure 13:
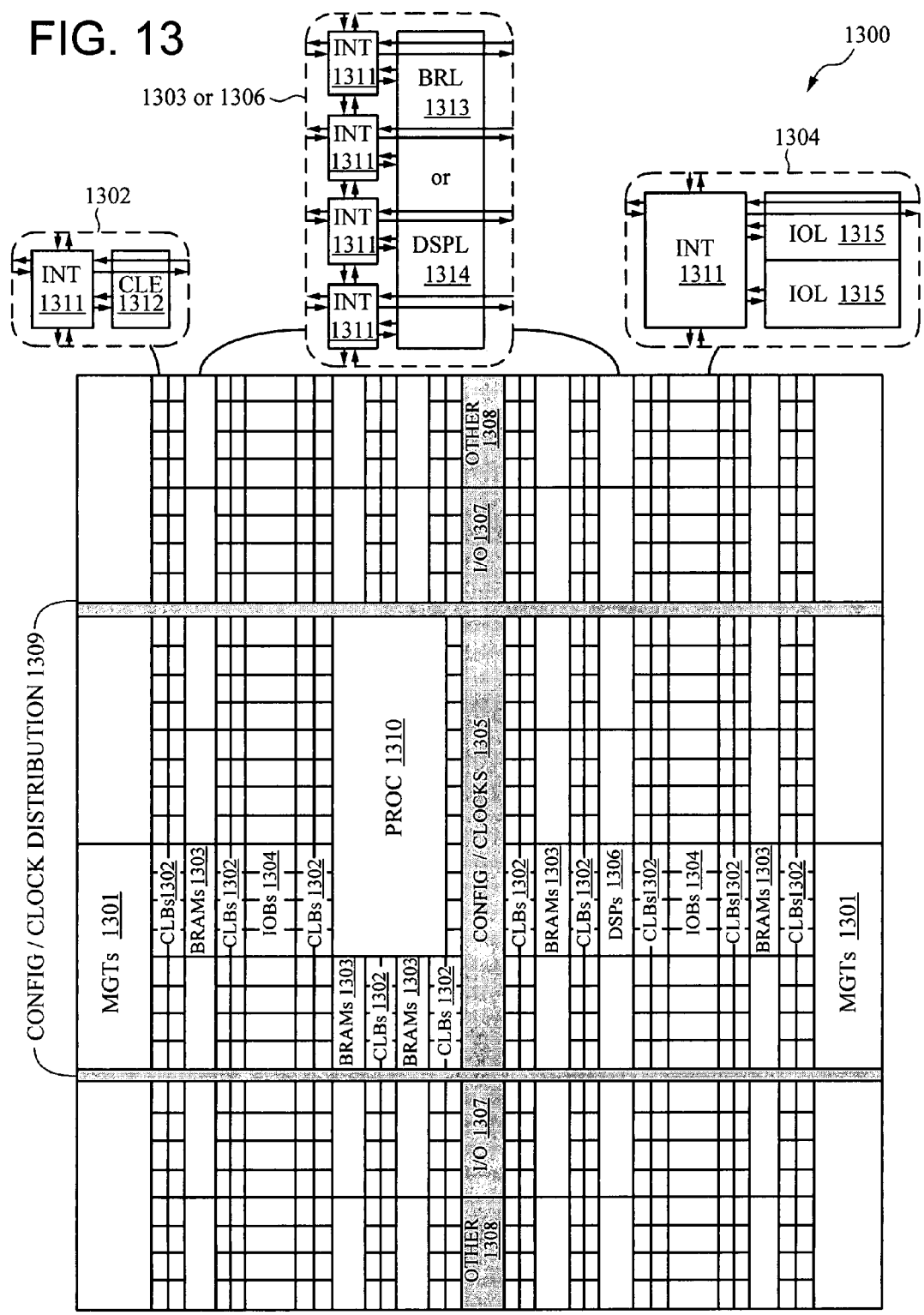
FIG. 13 illustrates an exemplary FPGA architecture.

FIG. 1 is a block diagram depicting an exemplary embodiment of an embedded processing system 100 in accordance with one or more aspects of the invention. The system 100 may be implemented using a programmable logic device (PLD), such as a field programmable gate array (FPGA). An exemplary FPGA is shown in FIG. 13 and described below. The system 100 is scalable and supports a number of user-definable features that make the system 100 usable as a base platform onto which user designs may be mapped. The system 100 supports a user-definable number of processing elements that can be used to perform various functions. The processing elements are in effect "virtual sockets" in which user-defined logic blocks (e.g., hardware blocks and/or software blocks) are "plugged". The virtual sockets are part of a "virtual socket platform" that interfaces with a processor executing software. The system 100 provides a standard communication interface between the software portion (e.g., microprocessor executing code) and the processing elements having the user-defined logic blocks. Platform-dependent aspects of the communication interface are encapsulated in a hardware-based application programming interface (API) and are thus abstracted from the user.

The system 100 comprises a processor block 102, a memory 104, and a virtual socket platform 106. The processor block 102 includes a processor 108 and an auxiliary processor unit (APU) 110. The virtual socket platform 106 includes a platform interface 112 a processing engine 114. The processing engine 114 includes sockets 116-1 through 116-N (collectively referred to as sockets 116), where N is an integer greater than zero. The sockets 116 are processing elements that encapsulate user-defined logic blocks. A port of the processor 108 is coupled to a port of the APU 110. Another port of the processor 108 is coupled to a port of the memory 104. Another port of the APU 110 is coupled to a port of the platform interface 112. Another port of the platform interface 112 is coupled to processing engine 114.

In the embodiment shown, the processor 108 is coupled to the virtual socket platform 106 via the APU 110. Those skilled in the art will appreciate that communication between the processor and the virtual socket platform 106 may be achieved using other types of interfaces know in the art. For example, the system 100 described herein may be adapted to use a processor bus interface, such as a processor local bus (PLB) in place of the APU 110.

In operation, the processor 108 executes software instructions. The processor 108 may be any type of microprocessor known in the art. The software instructions to be executed are stored in the memory 104 (software code 118). The software instructions comprise user-defined software (i.e., the software portion of a user's embedded system). The memory 104 generally represents the various types of memories associated with the processor 108. For example, the memory 104 may include memory integrated within the processor 108 (e.g., cache memory), memory within the PLD coupled to the processor 108, and/or memory external to the PLD coupled to the processor 108. The software instructions to be executed may be stored in cache memory, for example.

The virtual socket platform 106 provides hardware/software blocks for use by the processor 108. In particular, each of the sockets 116 provides an interface to a hardware or software block configured to perform a particular function or task. That is, each of the sockets 116 provides a "wrapper" for its corresponding logic block. A hardware block performs its task in hardware (e.g., using logic resources of the PLD). A software block performs its task by executing software instructions (e.g., via a processor). The hardware blocks are in effect "hardware accelerators" in that they perform their functions more efficiently than software implementations of such functions. The software blocks are in effect "software accelerators" in that they allow the processor 108 to delegate tasks that would otherwise consume resources of the processor 108 (e.g., computationally intensive tasks). The processor 108 may offload particular tasks to the virtual socket platform 106 thereby freeing processor resources to perform additional instructions and tasks.

The virtual socket platform 106 implements a fixed protocol for communication between the processor block 102 and the processing engine 114. As described below, various aspects of the virtual socket platform are configurable through use of a hardware-based API. The hardware-based API encapsulates the platform-dependent aspects of the communication protocol, specifically, communication between the APU 110 and the platform interface 112, and between the platform interface 112 and the processing engine 114. An advantage of such a socket-based system is the scalability provided. The complexity of the hardware-based API scales with the number of sockets, N. If only a single socket is employed (i.e., N=1), the hardware-based API exhibits minimum possible complexity.

In particular, some of the software instructions configured for execution by the processor 108 comprise auxiliary instructions that are sent by the processor 108 to the APU 110. The processor 108 determines which instructions are auxiliary instructions for the APU 110 using an operation code (op-code) in the instructions, as is well known in the art. An auxiliary instruction designated for the virtual socket platform 106 includes a task to be performed by the processing engine 114. The APU 110 forwards auxiliary instructions and associated data designated for the virtual socket platform 106 to the platform interface 112. The platform interface 112 provides a defined communication link between the processor block 102 and the processing engine 114.

In one embodiment, each auxiliary instruction designated for the virtual socket platform 106 comprises one of a load instruction, a store instruction, a register read instruction, or a register write instruction. A load instruction is used to pass instructions and data from the processor 108 to the processing engine 114 for performing particular tasks. A store instruction is used to read data resulting from performance of a task from the processing engine 114 to the processor 108. The register read and register write instructions are discussed in more detail below.

In one embodiment, the load instructions are in a packet format. FIG. 2 is a block diagram depicting an exemplary embodiment of a packet format 200 for an instruction in accordance with one or more aspects of the invention. The packet format 200 includes a priority field 206, an instruction field 208, and a packet length field 210. The instruction field 208 includes an instruction to perform a particular task. Note that the instructions to perform tasks are distinguishable from the load and store instructions discussed above, which are auxiliary instructions associated with the APU 110 ("APU instructions"). In this exemplary embodiment, the instruction field 208 comprises 12 bits. The processing engine 114 is configured to perform multiple tasks and thus supports multiple instructions. For example, assume instructions 0x10000A, 0x10000B, and 0x10000C correspond to operation 1, operation 2, and operation 3, respectively. If the instruction field 208 contains instruction 0x10000B, then the virtual socket platform 106 delegates the task to a socket in the processing engine 114 that can handle and perform operation 2.

The priority field 206 includes a priority value for the instruction. In this exemplary embodiment, the priority field 206 comprises 4 bits. The priority field 206 provides a mechanism for the processor to communicate to the virtual socket platform 106 the priority of the instruction. In one embodiment, the priority field 206 is used by the virtual socket platform 106 along with the relative speed information to decide which of the sockets 116 will perform the requested instruction. The packet length field 210 includes the length in bytes of data that follows. Notably, the priority field 206, the instruction field 208, and the packet length field 210 comprise a first word 202-1 of the packet and are thus the packet header (32-bit words). The packet may include one or more additional words, e.g., words 202-2, 202-3, and 202-4 are shown. The additional words include data associated with the instruction to be performed. In one embodiment, the load instruction is implemented using a burst of words, such as a quad-word burst or dual-word burst. The packet may include any number of words and thus may be divided over several consecutive load instructions. If more than one load instruction is needed to send the packet, only one header word is needed (in the first packet). Each following load burst will be a continuation of the packet and will contain only data until the specified packet length is met.

The APU 110 passes the header and data block of a packet conveyed by one or more load instructions to the platform interface 112. The APU 110 may also pass the load instruction itself to the platform interface 112. In an embodiment, the load instruction includes an extended op-code field that can be used by the platform interface 112 to determine the length of the bursts (e.g., single, dual, or quad word) from the APU 110.

The store instruction from the APU 110 is also in the packet format, but only includes header information. The header information includes the priority, the instruction, and the length in bytes to store. The APU 110 passes the header to the platform interface 112. The APU 110 may also pass the store instruction itself to the platform interface 112. The APU 110 then waits to receive data from the platform interface 112.

Figure 3:
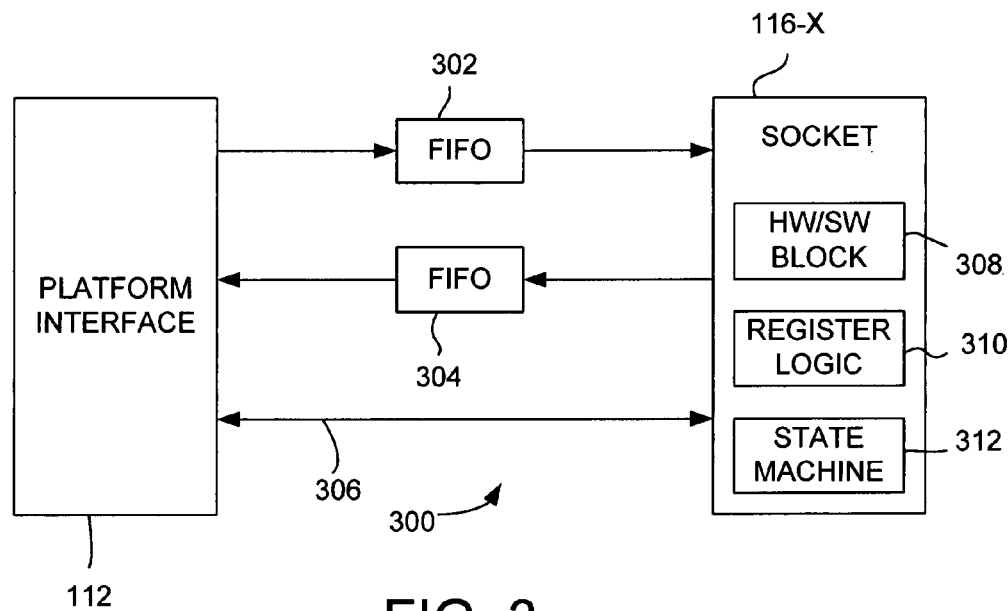
FIG. 3 is a block diagram depicting an exemplary embodiment of a communication link between a platform interface and a socket in accordance with one or more aspects of the invention.

FIG. 3 is a block diagram depicting an exemplary embodiment of a communication link 300 between the platform interface 112 and a socket 116-X in accordance with one or more aspects of the invention. For purposes of clarity, the link between the platform interface 112 and only one of the sockets 116 (referred to as socket 116-X) is shown. Those skilled in the art will appreciate that the platform interface 112 is coupled in identical fashion to each of the sockets 116.

The communication link 300 includes a first-in-first out buffer (FIFO) 302, a FIFO 304, and a bus 306. The FIFO 302 is a receive FIFO for receiving data from the platform interface 112 and providing data to the socket 116-X. The FIFO 304 is a send FIFO for receiving data from the socket 116-X and providing data to the platform interface 112. In one embodiment, the FIFOs 302 and 304 are asynchronous to support sockets 116 that operate on a difference clock frequency that the platform interface 112. The FIFOs 302 and 304 ensure that no data is lost in the transfer between the platform interface 112 and the socket 116-X. In one embodiment, the FIFOs 302 and 304 comprise LocalLink FIFOs, as described in Application Note XAPP691, "Parameterizable LocalLink FIFO," by Wen Ying Wei and Dai Huang, published Feb. 2, 2004 by Xilinx, Inc., which is incorporated by reference herein. As described in XAPP691, the LocalLink interface defines a set of protocol-agnostic signals that allow transmission of packet-oriented data and enables a set of features such as flow control and transfer of data of arbitrary length.

The socket 116-X includes a hardware or software block 308 (referred to as HW/SW block or generally as a logic block) configured to perform one or more functions. The socket 116-X also includes register logic 310 and a data transfer state machine 312. The socket 116-X provides a standard interface or "wrapper" for the HW/SW block 308. The data transfer state machine 312 is configured to control data flow to the HW/SW block 308 from the FIFO 302, and from the HW/SW block 308 to the FIFO 304. For example, the data transfer state machine 312 may handle a LocalLink interface to the FIFOs 302 and 304. The data transfer state machine 312 also may control data flow to/from the register logic 310. The register logic 310 is used to write and read control information.

Figure 4:
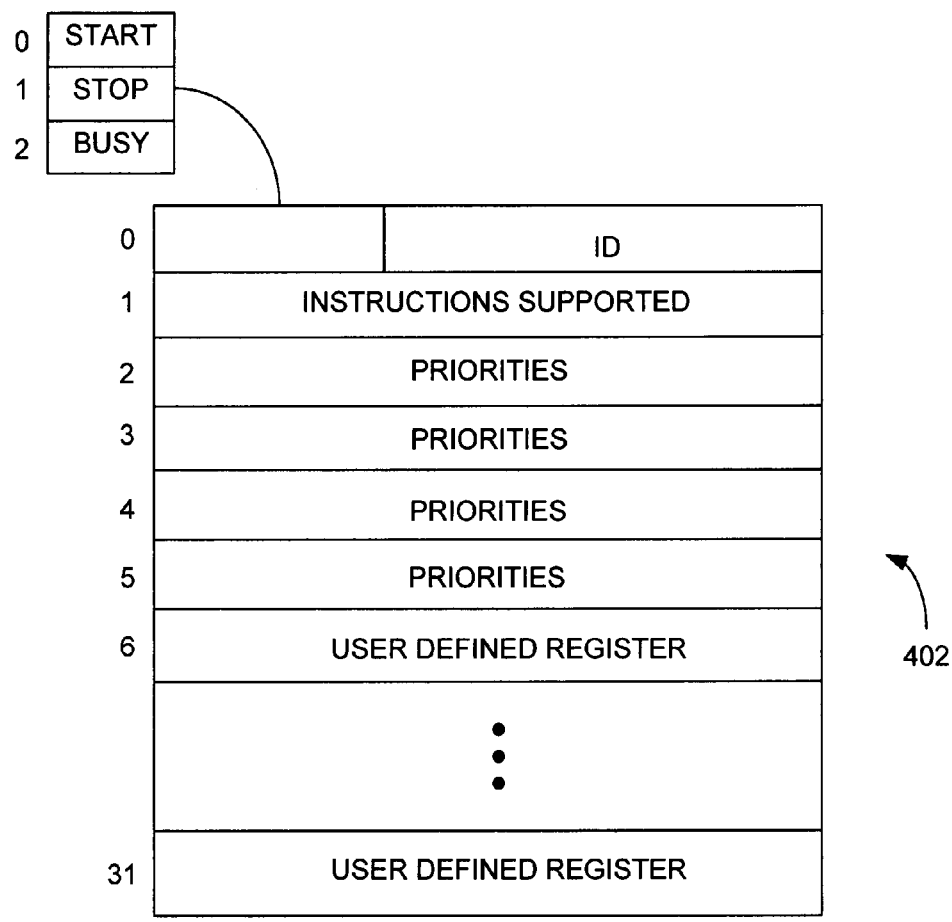
FIG. 4 is a block diagram depicting an exemplary embodiment of register logic in a socket in accordance with one or more aspects of the invention.

FIG. 4 is a block diagram depicting an exemplary embodiment of the register logic 310 in accordance with one or more aspects of the invention. In this exemplary embodiment, the register logic 310 includes 32 registers, designated as register 0 through register 31 (generally referred to as registers 402). Each of the registers 402 stores 32 bits (i.e., word-sized registers). The register 0 includes three flags, designated as Start, Stop, and Busy, followed by a unique identifier for the socket (29-bits). The Start flag indicates whether the HW/SW block 308 has started processing data, the Stop flag indicates that the HW/SW block 308 has stopped processing data, and the Busy flag indicates that the HW/SW block 308 is busy processing data. The register 1 includes a bit array of instructions that the HW/SW block 308 is capable of performing. An asserted bit in the bit-array denotes that the HW/SW block 308 can perform a particular instruction and vice-versa for a de-asserted bit. Thus, in the present embodiment, the HW/SW block 308 can handle one or more of 32 possible instructions.

The registers 2 through 5 store four-bit priorities associated with the particular instructions. In one embodiment, a four-bit priority comprises a metric representative of the time it takes for the HW/SW block 308 to complete the particular instruction (i.e., a speed/performance metric). The priority may comprise other metrics or combinations of metrics. The registers 6 through 31 may store user-defined data. Those skilled in the art will appreciate that the register configuration in FIG. 4 is merely exemplary. The register logic 310 may include more or less registers, which may be larger or smaller than 32-bits. The register logic 310 may support more or less than 32 possible instructions and associated priorities.

Returning to FIG. 3, the register logic 310 is accessed via the bus 306. In one embodiment, the bus 306 includes 32 read data lines, 32 write data lines, five address lines, a write enable line, and a clock line. The register to be accessed is determined by the five address lines. The write enable line forces the register identified by the address lines to be written with the contents of the write data lines. The contents of the register specified by the address lines is always present of the read data lines. All register operations occur in accordance with a clock signal on the clock line, thus allowing the socket 116-X and the platform interface 112 to share data while operating on difference clock frequencies.

Returning to FIG. 1, the APU 110 may send register read and register write instructions to the platform interface 112 for reading and writing register logic in the processing engine 114. A register read instruction includes a header as described above followed by a single word of the data to be written. A register write instruction also includes a header as described above. In both the register read and register write instructions, the packet length value in the header contains both an identifier of the socket that is to be accessed and an identifier of a specific register in the socket.

The socket 116-1 is referred to as the master socket. The master socket 116-1 may be configured similarly to the socket 116-X described above with respect to FIG. 3. The master socket 116-1 may also include system parameter registers 120. The system parameter registers 120 may store information such as an identifier for the virtual socket platform 106, a list of instructions serviceable by the processing engine 114, and the like. The master socket may contain functionality used by all the sockets 106, as well as the processor 108, such as access to shared memory and communication devices such as audio and video players and displays.

Figure 5:
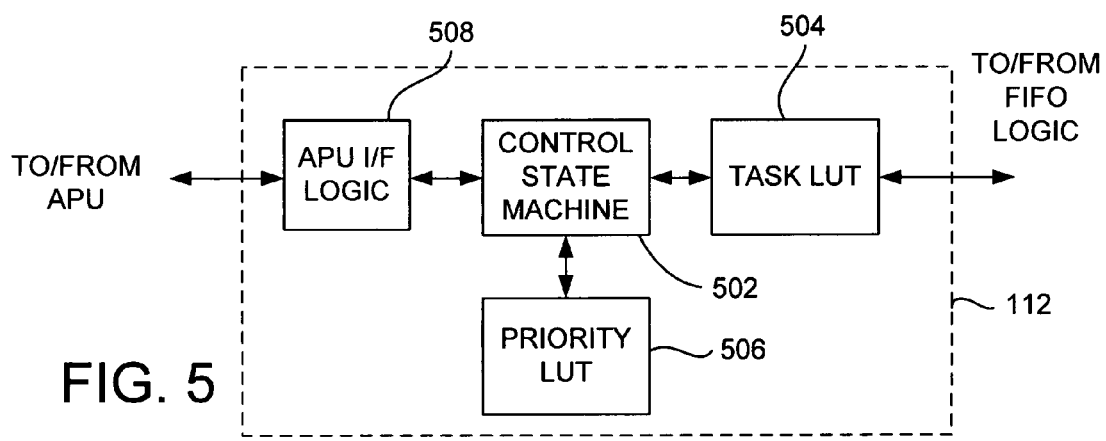
FIG. 5 is a block diagram depicting an exemplary embodiment of a platform interface in accordance with one or more aspects of the invention.

FIG. 5 is a block diagram depicting an exemplary embodiment of the platform interface 112 in accordance with one or more aspects of the invention. The platform interface 112 includes APU interface (I/F) logic 508, a control state machine 502, a task lookup table (LUT) 504, and a priority LUT 506. The APU interface logic 508 is coupled to the APU 110 and the control state machine 502. The APU interface logic 508 is configured to decode instructions received from the APU 110 (e.g., load instructions, store instructions, register read/write instructions). The APU interface logic 508 passes the header information or header and data information to the control state machine 502.

Upon receipt of an instruction to be performed, the control state machine 502 uses the priority LUT 506 to determine an available socket having a selected priority (e.g., selected runtime) for the particular operation to be performed. The instruction field 208 determines which operation is to be performed. FIG. 6 is a block diagram depicting an exemplary embodiment of a table 600 representative of the data stored in the priority LUT 506 in accordance with one or more aspects of the invention. The table 600 stores information representing which of the sockets is capable of performing which instructions. The table 600 includes N rows 602-0 through 602-N−1 corresponding to instruction 0 through instruction N−1, where N is the number of instructions serviceable by the processing engine 114. The table 600 includes X columns 604, where X is the number of sockets in the processing engine 114 configured with a hardware/software block. In the present example, columns 604-1 through 604-8 are shown by way of example. In one embodiment, each entry in the table 600 defined by a row and column comprises 5 bits, which is the width used to specify the identity of a particular socket (e.g., 5-bit identifier to identify up to a maximum of 32 sockets).

In one embodiment, for each instruction (each row 602), sockets are listed in priority order from the leftmost column to the rightmost column. Thus, the socket with the highest priority (e.g., fastest runtime) is in the first column 604-1, the socket with the next highest priority (second fastest runtime) is in the second column 604-2, and so on until the socket with the lowest priority (slowest runtime) in the last column 604-8. Note that there may not be 8 possible sockets for every instruction. Some instructions may be capable of being performed by only one socket or, in general, a plurality of sockets. Those skilled in the art will appreciate that the table 600 is merely exemplary. In general, the priority LUT 506 may implement a table that contains N rows for each of the N instructions, and a user-selectable number of columns associated with a user-specified maximum number of sockets that can perform the same instruction. The width of each column would be $\log_2$(number of sockets). Thus, the priority LUT 506 may be scalable to a smaller size or a larger size depending on specifications of the user. For each instruction, the sockets capable of performing the instruction are sorted based on a cost function. In one embodiment, the cost function is priority-based, where higher priority indicates faster runtime and lower priority indicates slower runtime. In this manner, the table 600 is configured to store a measure of the relative speed in which each socket can perform its respective instructions.

In one embodiment, the table 600 is dynamically updated based on the reconfiguration of one or more of the sockets 116 and, hence, the modification of the capabilities of the sockets. As is well known in the art and described below with respect to FIG. 13, an FPGA can be reconfigured multiple times, including partial reconfiguration of a portion of the FPGA while the rest of the FPGA is powered and operating. A user of the system 100 may decide to reconfigure a portion of the sockets 116 based on criteria such as operation usage statistics, knowledge of future operations, the performance of the sockets, and upgrades and improvements to the sockets. As the capability of performing instructions changes via reconfiguration of one or more sockets, the table 600 is dynamically updated to reflect the changes.

Returning to FIG. 5, the control state machine 502 may determine if the socket having the selected priority for the particular operation to be performed is available by checking the Busy flag in the register logic 310 of the socket. The selected priority may be based on the priority in the header for the instruction (i.e., the priority field 206 shown in FIG. 2). If the task is high priority, then the control state machine 502 will use an available socket having the highest priority as determined from the priority LUT 506. If the task is a lower priority, the control state machine 502 uses an available socket having a lower (or lowest) priority as determined from the priority LUT 506. The control state machine 502 is also configured to initialize the priority LUT 506. The control state machine 502 loads the priority LUT 506 with the priorities of each of the instructions that are supported by the processing engine 114. Once a socket is selected, data is sent or read from a respective FIFO coupled to the selected socket.

Figure 7:
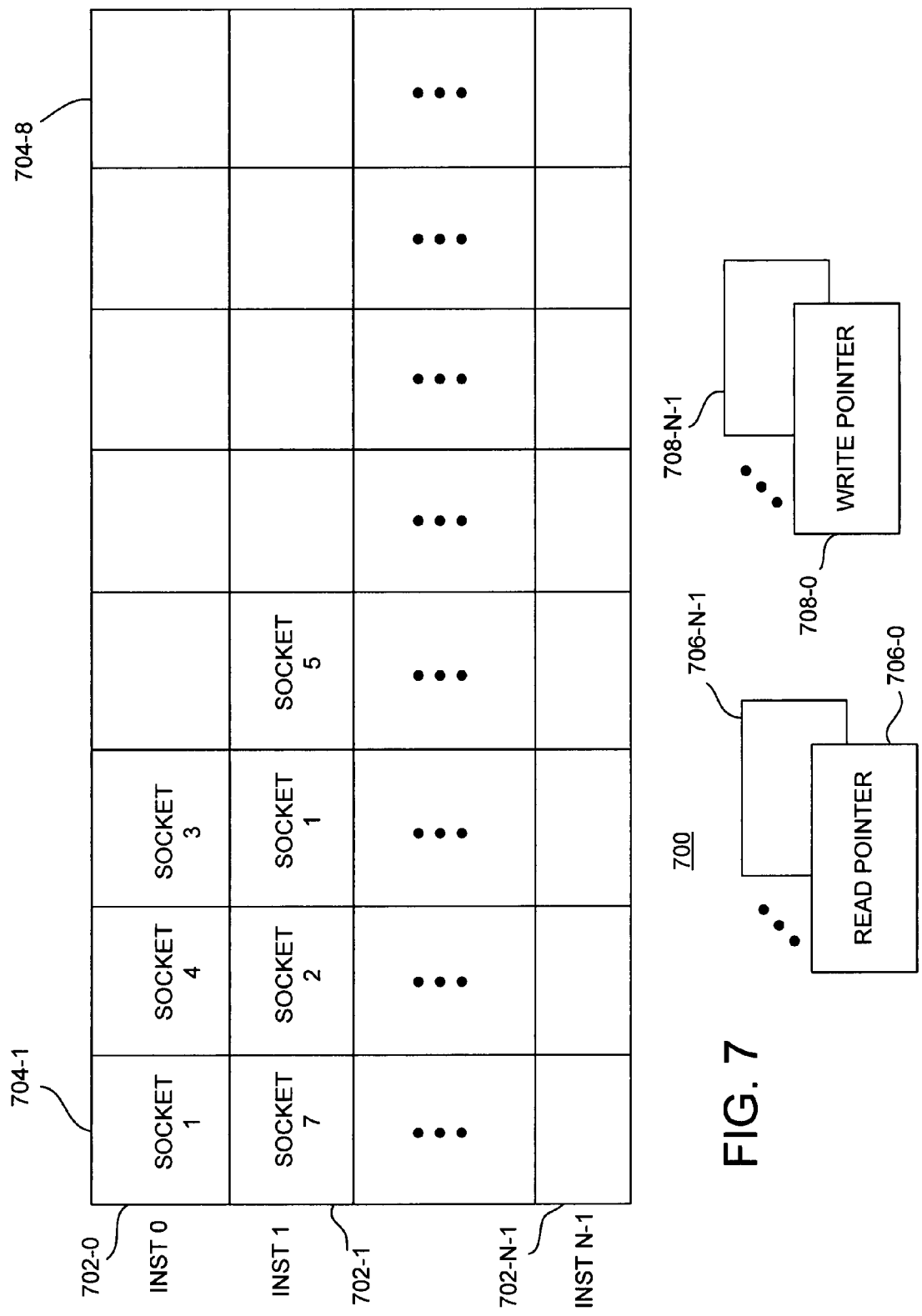
FIG. 7 is a block diagram depicting an exemplary embodiment of a table representative of data stored in a task lookup table of the platform interface in accordance with one or more aspects of the invention.

The control state machine 502 also stores task identifiers (task IDs) in the task LUT 504. The task LUT 504 is used to track which socket has recently handled which instruction. FIG. 7 is a block diagram depicting an exemplary embodiment a table 700 representative of the data stored in the task LUT 504 in accordance with one or more aspects of the invention. The table 700 is configured to store information representing which of the instructions is being serviced by which of the sockets. The table 700 includes N rows 702-0 through 702-N−1 corresponding to instruction 0 through instruction N−1, where N is the number of instructions serviceable by the processing engine 114. The table 700 includes X columns 704, where X is the number of sockets in the processing engine 114 configured with a hardware/software block. In the present example, columns 704-1 through 704-8 are shown by way of example. Similar to the embodiment of table 600 described above, each entry in the table 700 defined by a row and column comprises 5 bits, which is the width used to specify the identity of a particular socket (e.g., 5-bit identifier for a maximum of 32 sockets).

Each of the instructions is associated with a read pointer and a write pointer. Thus, the table 700 also includes read pointers 706-0 through 706-N−1, and write pointers 708-0 through 708-N−1. Each row 702 is in effect a FIFO. When a packet is sent to a particular socket for processing, the control state machine 502 pushes the socket identifier into the FIFO for the particular instruction. The socket identifier is written to a particular column 704 pointed to by the write pointer 708 of the particular instruction and the write pointer is incremented. For example, for the instruction 0, three packets were sent to the sockets 1, 4, and 3, respectively. The write pointer 708-0 now points to the column 704-4, which is the tail of the FIFO.

When a store instruction is received by the control state machine 502, the control state machine 502 selects the socket to read data from by popping the FIFO for the instruction indicated in the store instruction. That is, the read pointer 706 for a given instruction points to the head of the FIFO. For example, for the instruction 0, assume the read pointer 706-0 points to the column 704-2. Then, if the control state machine 502 receives a store instruction indicating instruction 0, then data is read from the socket 4. The read pointer 706-0 is then incremented. The table 700 guarantees that the socket read from will be the socket that has the most outstanding call to that particular instruction. That is, for each instruction, the sockets are ordered in the FIFO based on time of service. Similar to the priority LUT 506, those skilled in the art will appreciate that the table 700 is merely exemplary. In general, the task LUT 504 may implement a table that contains N rows for each of the N instructions, and a user-selectable number of columns associated with a user-specified maximum number of sockets that can perform the same instruction. The width of each column would be $\log_2$(number of sockets). Thus, the task LUT 504 may be scalable to a smaller size or a larger size depending on specifications of the user.

In one embodiment, the control state machine 502 is configured to select more than one socket to perform a particular instruction. That is, the control state machine 502 implements a redundancy scheme in the selection of sockets to perform instructions. The sockets process the instruction. The control state machine 502 then selects the "winner" of the selected sockets and data from the winning socket is passed back to the processor. The winning socket may be determined based on various metrics, such as a run-time metric, a parity check of the results, and the like. The control state machine 502 may also decide what to do with the "losers" of the selected sockets, including not selecting the socket for future instructions, forcing the socket in a self-test mode, and reconfiguring the socket to a new function.

Figure 8:
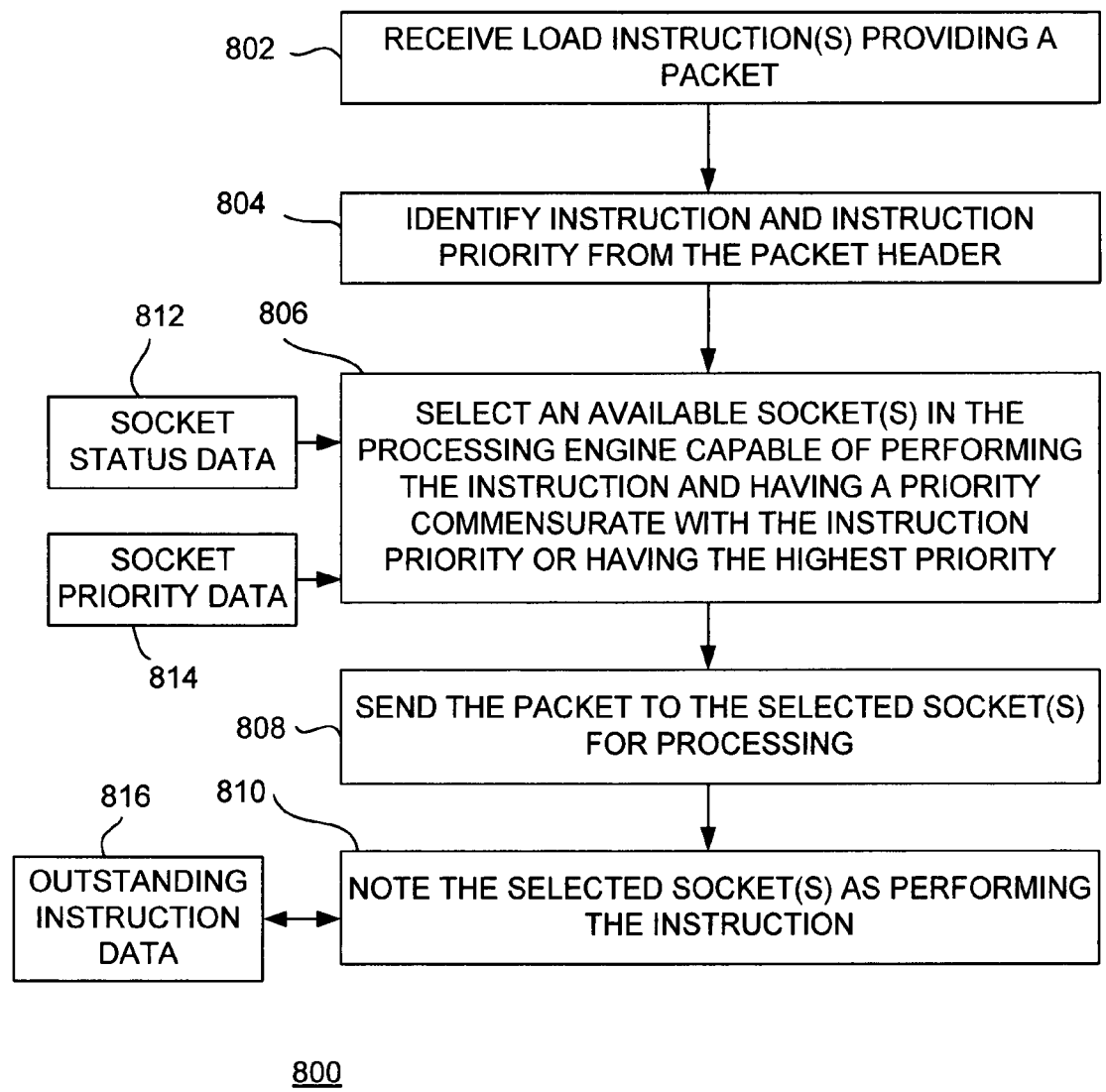
FIG. 8 is a flow diagram depicting an exemplary embodiment of a method for sending a task to be performed from a processor block to a virtual socket platform in accordance with one or more aspects of the invention.

FIG. 8 is a flow diagram depicting an exemplary embodiment of a method 800 for sending a task to be performed from the processor block 102 to the virtual socket platform 106 in accordance with one or more aspects of the invention. The method 800 begins at step 802, where one or more load instructions are received to provide a packet. As described above, the APU 110 provides one or more load instructions to the platform interface 112 in a packet format. At step 804, an instruction and an instruction priority is identified from the packet header.

At step 806, at least one available socket in the processing engine 114 capable of performing the instruction and having either a priority commensurate with the instruction priority or the highest priority is selected. The socket(s) is/are selected based on socket status data 812 and socket priority data 814. The socket status data includes information as to which sockets in the processing engine are available to process data (e.g., not busy). As described above, such information may be obtained from the register logic 310 in each of the sockets via the Busy flag. The socket priority data 814 includes the information represented by the priority LUT 506. The socket priority data may indicate that several sockets are capable of performing the identified instruction. In one embodiment, an available socket(s) having a priority commensurate with the instruction priority is selected (i.e., highest instruction priority, highest priority socket; lower instruction priority, lower priority socket; etc.). In another embodiment, an available socket(s) having the highest priority is always selected, regardless of the instruction priority.

At step 808, the packet is sent to the selected socket(s) for processing. In an embodiment, the packet is pushed into the receive FIFO 302 of the selected socket(s). The selected socket(s) pops the packet from the receive FIFO 302 and performs the requested operation on the data block. At step 810, the selected socket(s) is/are noted as performing the instruction in outstanding instruction data 816. The outstanding instruction data includes information represented by the task LUT 504. As discussed above, an identifier for the selected socket(s) is pushed into a FIFO associated with the instruction to be performed and a write pointer for the instruction is updated.

Figure 9:
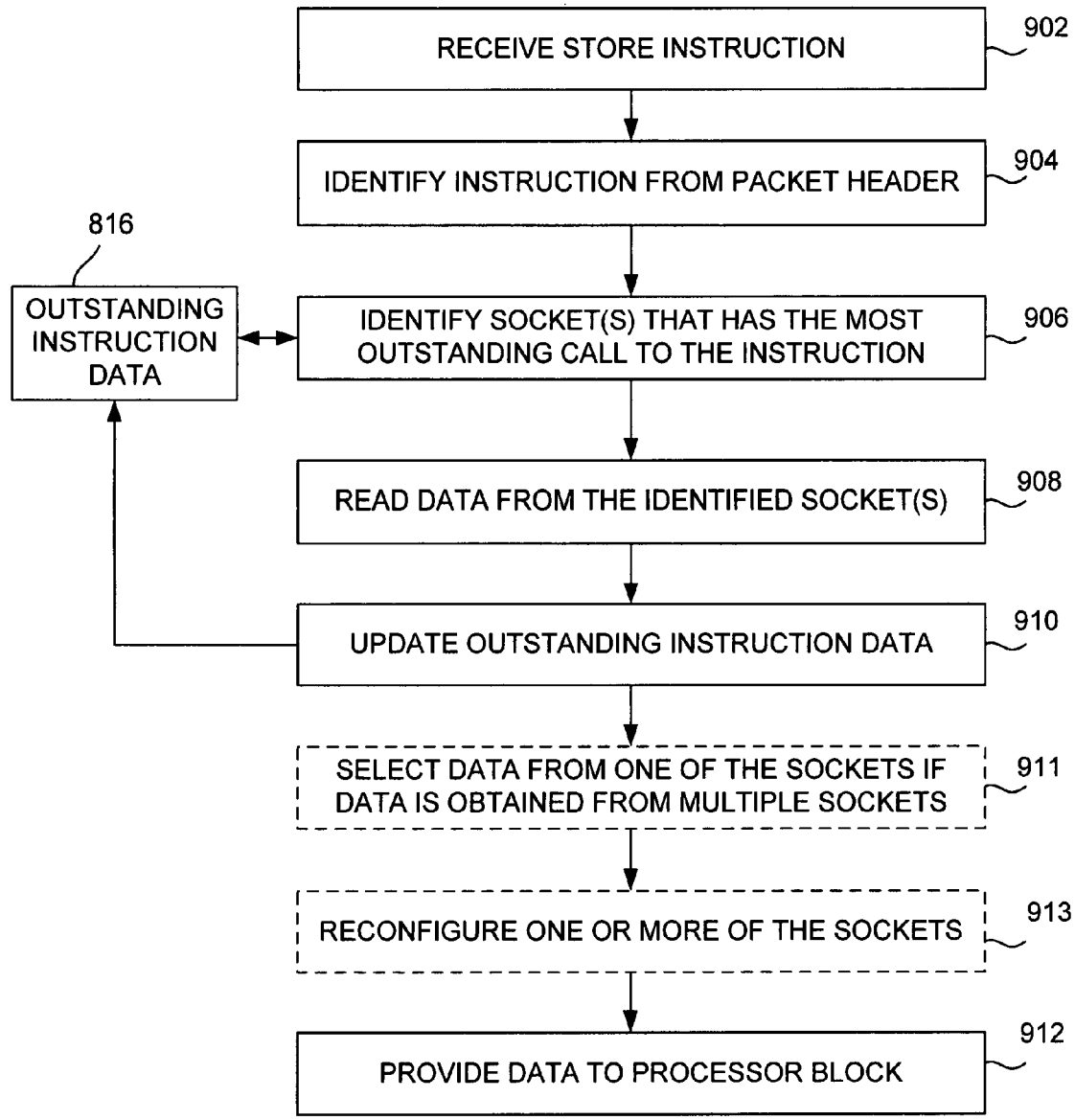
FIG. 9 is a flow diagram depicting an exemplary embodiment of a method for reading data generated by performance of a task from a virtual socket platform to a processor block in accordance with one or more aspects of the invention.

FIG. 9 is a flow diagram depicting an exemplary embodiment of a method 900 for reading data generated by performance of a task from the virtual socket platform 106 to the processor block 102 in accordance with one or more aspects of the invention. The method 900 begins at step 902, where a store instruction is received. As described above, the APU 110 provides the store instruction to the platform interface 112 in a packet format. At step 904, an instruction is identified from the packet header.

At step 906, one or more sockets having the most outstanding call(s) to the instruction is/are identified from the outstanding instruction data 816. As discussed above, a socket identifier is popped from a FIFO associated with the instruction and the read pointer is updated. Moreover, multiple sockets may have been selected to perform a particular instruction in a redundancy scheme. At step 908, data is read from the identified socket(s). In an embodiment, the data to be read is pushed into the read FIFO 304 of the identified socket(s). The platform interface 112 pops the data to be read from the read FIFO 304. At step 910, the outstanding instruction data 816 is updated (i.e., the read pointer is updated). At optional step 911, if data is obtained from more than one socket, data is selected from one of the sockets (e.g., a winning socket is chosen, as described above). At optional step 913, if data is obtained from more than one socket, at least one of the sockets is reconfigured (e.g., one or more of the losing sockets is/are reconfigured, as described above). At step 912, the data is provided from the platform interface 112 to the APU 110.

Figure 10:
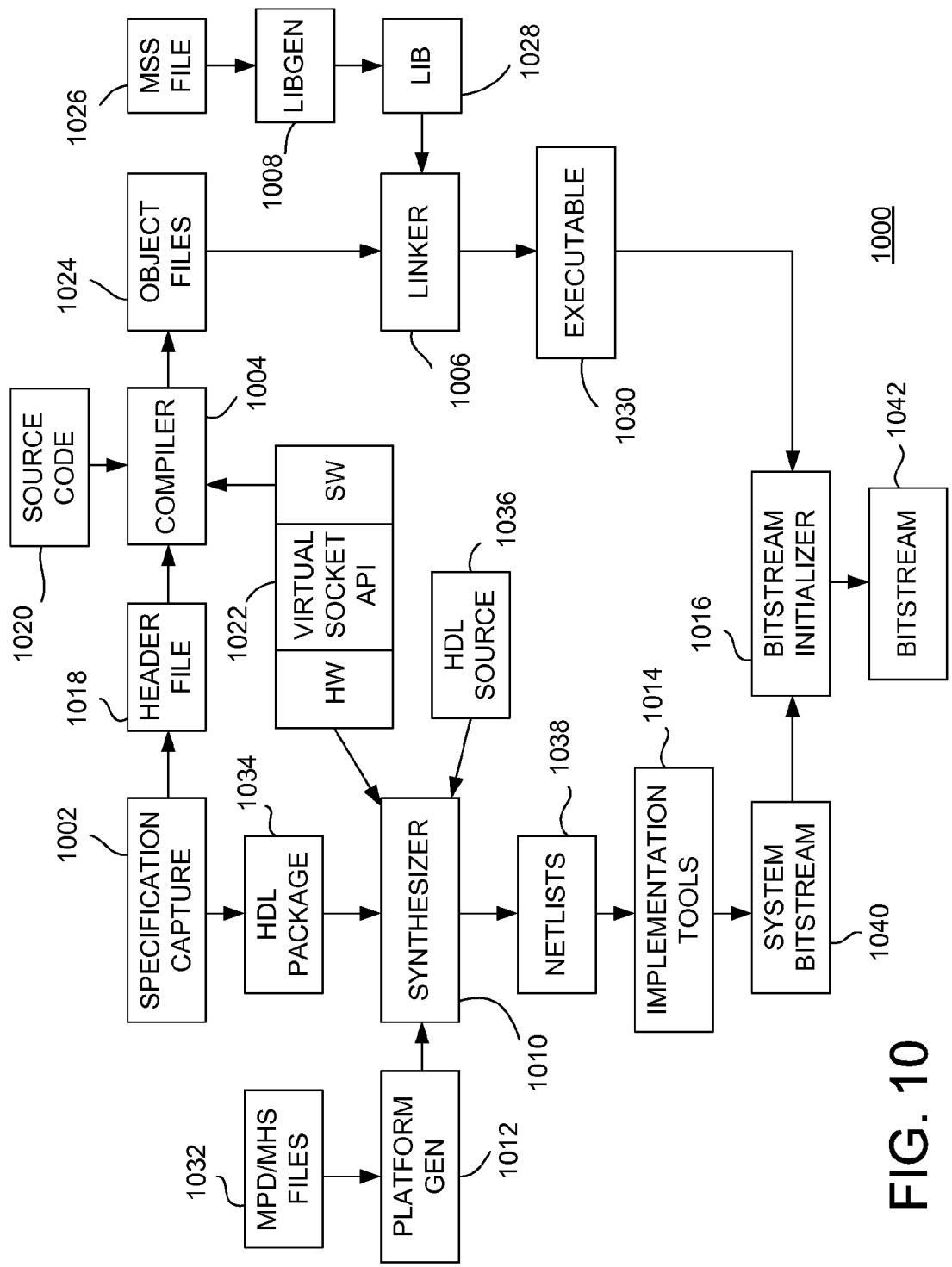
FIG. 10 is a block diagram depicting an exemplary embodiment of an embedded design development system in accordance with one or more aspects of the invention.

FIG. 10 is a block diagram depicting an exemplary embodiment of an embedded design development system 1000 in accordance with one or more aspects of the invention.

The system 1000 may be used to produce an embedded design using a PLD in accordance with embodiments of the invention described above. Notably, a base platform has been described that supports a user-defined number of processing elements and is generic in the sense that a number of different embedded system designs may be mapped to it. As discussed above, the base platform includes a hardware-based API that defines the specific communication mechanisms used by the platform and provides a standard interface to the custom processing elements defined in the PLD fabric. The design system 1000 maps a user's design onto this base platform. The standard interface to the custom processing elements allows the use of a "wrapper" to include user-defined logic blocks into the base platform. The wrapper for the user's hardware source code allows system build files (e.g., microprocessor hardware specification (MHS), microprocessor software specification (MSS), and the like) to be application-independent and usable for multiple applications. The hardware-based API provides both hardware and software API libraries for facilitating automation in the design system.

The system 1000 includes a specification capture module 1002, a compiler 1004, a linker 1006, a library generator 1008, a synthesizer 1010, a platform generator 1012, implementation tools 1014, and a bitstream initializer 1016. The specification capture module 1002 is configured to capture specification data for the system. The specification data includes various parameters specification to the user's system design. Exemplary user-defined parameters include: (1) the number of processing elements in the platform; (2) the tasks supported by the processing elements and the corresponding instructions and op-codes to perform the tasks; (3) whether writes and/or reads to processing elements are supported; (4) the size of the memories used by the processor; (5) the target PLD platform (e.g., part number, communication protocol used); (6) data to be stored in user-defined register logic; and (7) the name of the project.

In one embodiment, the specification capture module 1002 comprises a graphical user interface (GUI) through which the user may interact to define the parameters. Other techniques may be used, such as manual editing of a parameter file. In one embodiment, the specification capture module 1002 includes an automated build script that will automatically build the user design in response to the defined parameters. The automated build script will control the execution of the other tools in the design system 1000. In this manner, the specification capture module 1002 provides a single entry point for the user. The specification capture module 1002 automatically creates one or more hardware description language (HDL) package files 1034 and one or more source code header files 1018 in response to the defined parameters.

A virtual socket API 1022 provides a wrapper for hardware (HW) and software (SW) aspects of the base platform. The source code header file(s) 1018 map user-defined parameters onto the SW portion of the API 1022. That is, the software code header file(s) 1018 define the configurable attributes of the software portion of the base platform. The user source code 1020 utilizes data and functions defined in the SW portion of the API 1022 and in the header file(s) 1018 to delegate tasks to user-defined logic blocks in the platform. The SW portion of the API 1022 encapsulates the platform-dependent aspects of communication with the user-defined logic blocks. The compiler 1004 receives the user source code 1020 and the header file(s) 1018, and accesses the SW portion of the API 1022. The compiler 1004 compiles the user source code 1020 to produce one or more object files 1024.

The library generator 1008 configures libraries, device drivers, file systems, and interrupt handlers for the system to create a software platform. A description of the software platform is maintained a microprocessor software specification (MSS) file 1026. Since the user-defined aspects of the system are wrapped by the virtual socket API 1022, the MSS file 1026 is application-independent. That is, the MSS file 1026 may be defined generally for the base platform and does not require any user-defined parameters. The library generator 1008 processes the MSS file 1026 to produce one or more libraries 1028. The linker 1006 receives the object file(s) 1024 and the libraries 1028 and produces an executable file 1030 in a well known manner.

The synthesizer 1010 is configured to receive a behavioral hardware description of the system and produce a logical or gate-level description, e.g., logical network lists (netlists 1038). The platform generator 1012 produces a top-level HDL design file for the system to define the hardware platform. A description of the hardware platform is maintained in a microprocessor hardware specification (MHS) file and in one or more microprocessor peripheral definition (MPD) files (MPD/MHS files 1032). Since the user-defined aspects of the system are wrapped by the virtual socket API 1022, the MPD/MHS files 1032 are application-independent. That is, the MPD/MHS files 1032 may be defined generally for the base platform and do not require any user-defined parameters.

The HDL package file(s) 1034 map user-defined parameters onto the HW portion of the API 1022. That is, the HDL package file(s) 1034 define the configurable attributes of the hardware portion of the base platform. The user HDL code 1036 defines the various user-defined logic blocks used in the system. The user HDL code 1036 utilizes constructs defined in the HW portion of the API 1022 to establish a communication interface between the logic blocks and the base platform. The HW portion of the API 1022 encapsulates the platform-dependent aspects of the communication interface between the platform and the user-defined logic blocks.

The synthesizer 1010 receives the HDL package file(s) 1034, the HDL source 1036, and a top-level HDL design file from the platform generator 1012 to produce the netlist(s) 1038. The implementation tools 1014 process the netlist(s) 1038 to produce a system bitstream 1040 for configuring a PLD. For example, the implementation tools 1014 may comprise well-known map, place-and-route, and bitstream generation tools for implementing a design in a PLD, such as an FPGA. The bitstream initializer 1016 receives the system bitstream 1040 and the executable file 1030. The bitstream initializer 1016 initializes memory coupled to the processor with the executable file 1030 (i.e., software instructions). The bitstream initializer 1016 produces a bitstream 1042 that can be loaded into a PLD to implement the designed system.

Figure 11:
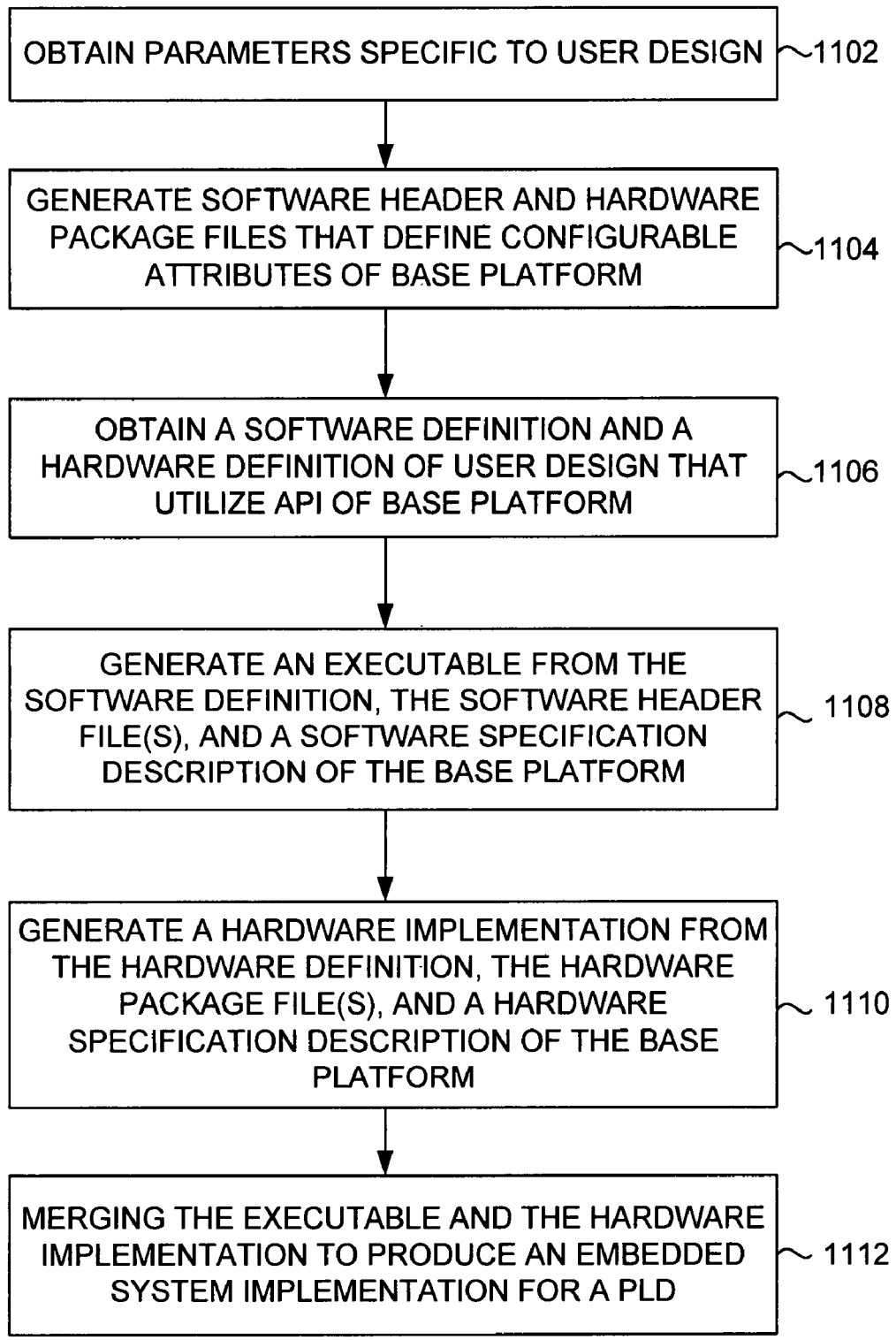
FIG. 11 is a flow diagram depicting an exemplary embodiment of a method for designing an embedded system in accordance with one or more aspects of the invention.

FIG. 11 is a flow diagram depicting an exemplary embodiment of a method 1100 for designing an embedded system in accordance with one or more aspects of the invention. The method 1100 begins at step 1102, where parameters specific to a user design of an embedded system are obtained. The parameters are related to a base platform having a processor and a configurable number of processing elements. In an embodiment, the parameters include a selected number of the processing elements and instructions supported by each of the processing elements. Various other parameters may also be obtained as described above. At step 1104, software header and hardware package files are generated that define configurable attributes of the base platform. The software header and hardware package files are generated based on the parameters for the user design obtained at step 1102.

At step 1106, a software definition and a hardware definition of the user design are obtained. The software and hardware definitions utilize an API of the base platform. The software definition includes software source code written by the user for execution by the processor of the base platform. The software source code uses the API of the base platform to communicate with the defined processing elements. The hardware definition includes HDL source code that describes logic blocks to be implemented by the processing elements. The HDL source code uses the API of the base platform to establish an interface between the logic blocks and the processing elements.

At step 1108, an executable is generated from the software definition, the software header file(s), and a software specification description of the base platform. The software specification description may comprise a MSS file. Since the configurable attributes of the base platform are included in the software header file(s), the software specification description of the base platform is independent of the user design. The executable is generated by compiling the software definition to form object file(s), generating library file(s) from the software specification description, and linking the object file(s) with the library file(s) to produce the executable.

At step 1110, a hardware implementation is generated from the hardware definition, the hardware package file(s), and a hardware specification description of the base platform. The hardware specification description of the base platform may comprise MPD and MHS files. Since the configurable attributes of the base platform are included in the hardware package file(s), the hardware specification description of the base platform is independent of the user design. The hardware implementation is generated by generating a top-level HDL design file from the hardware specification description of the base platform, synthesizing the hardware package file(s), the top-level HDL design file, and the hardware definition of the user design to produce logical network lists, and implementing the logical network lists for a target PLD (e.g., map, place-and-route, and bitstream generation). At step 1112, the executable and the hardware implementation are merged to produce an embedded system implementation for a target PLD. In an embodiment, the embedded system implementation is produced by initializing a bitstream for the target PLD with the executable.

Figure 12:
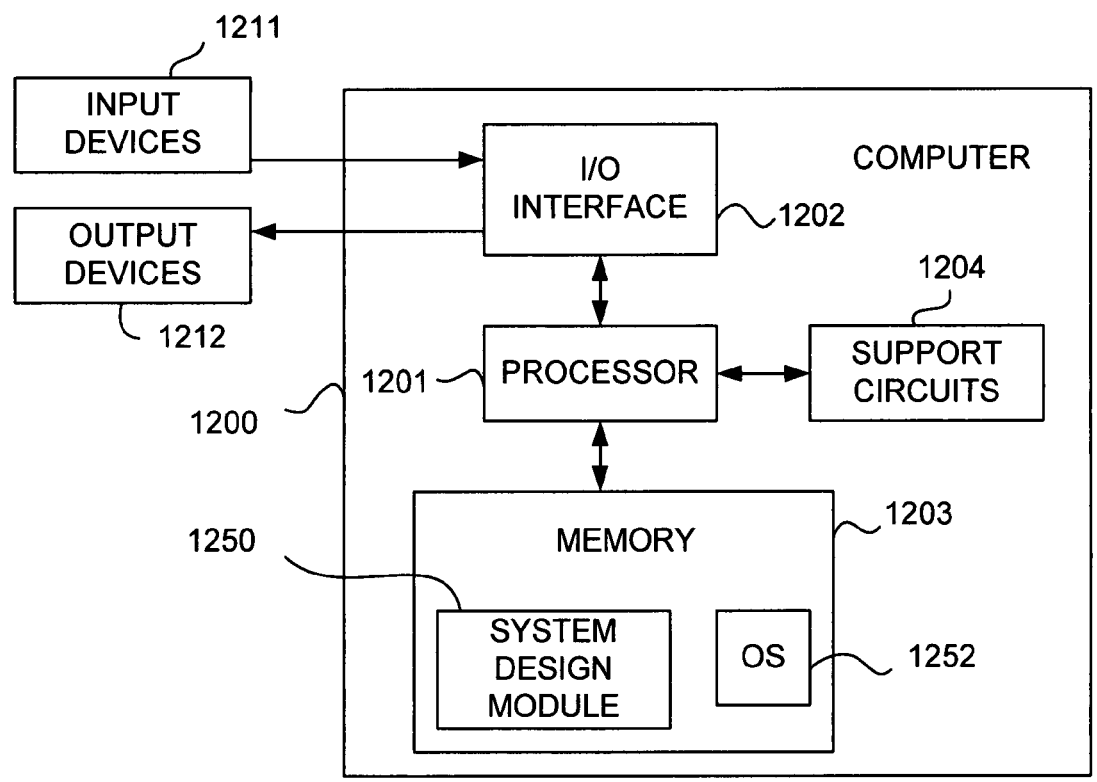
FIG. 12 is a block diagram depicting an exemplary embodiment a computer suitable for implementing the design system of FIG. 10 and the design method of FIG. 11 in accordance with one or more aspects of the invention.

FIG. 12 is a block diagram depicting an exemplary embodiment a computer 1200 suitable for implementing the design system 1000 and the design method 1100 in accordance with one or more aspects of the invention. The computer 1200 includes a processor 1201, a memory 1203, various support circuits 1204, and an I/O interface 1202. The processor 1201 may include one or more microprocessors known in the art. The support circuits 1204 for the processor 1201 include conventional cache, power supplies, clock circuits, data registers, I/O interfaces, and the like. The I/O interface 1212 may be directly coupled to the memory 1203 or coupled through the processor 1201. The I/O interface 1202 is coupled to various input devices 1211 (e.g., keyboard, mouse, and the like) and output devices 1212 (e.g., display, printer, and the like).

The memory 1203 stores processor-executable instructions and/or data that may be executed by and/or used by the processor 1201. These processor-executable instructions may comprise hardware, firmware, software, and the like, or some combination thereof. Modules having processor-executable instructions that are stored in the memory 1203 include system design module 1250. The system design module 1250 is configured to implement the design system 1000 and perform the method 1100. The computer 1200 may be programmed with an operating system 1252, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 1203. The memory 1203 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of media, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD) Such media, when carrying computer-readable instructions that direct functions of the invention, represent computer readable media embodiments of the invention.

As noted above, advanced FPGAs can include several different types of programmable logic blocks in the array. For example, FIG. 13 illustrates an FPGA architecture 1300 that includes a large number of different programmable tiles including multi-gigabit transceivers (MGTs 1301), configurable logic blocks (CLBs 1302), random access memory blocks (BRAMs 1303), input/output blocks (IOBs 1304), configuration and clocking logic (CONFIG/CLOCKS 1305), digital signal processing blocks (DSPs 1306), specialized input/output blocks (I/O 1307) (e.g., configuration ports and clock ports), and other programmable logic 1308 such as digital clock managers, analog-to-digital converters, system monitoring logic, and so forth. Some FPGAs also include dedicated processor blocks (PROC 1310).

In some FPGAs, each programmable tile includes a programmable interconnect element (INT 1311) having standardized connections via routing conductor segments to and from a corresponding interconnect element in each adjacent tile. Therefore, the programmable interconnect elements and routing conductor segments taken together implement the programmable interconnect structure for the illustrated FPGA. The programmable interconnect element (INT 1311) also includes the connections to and from the programmable logic element within the same tile, as shown by the examples included at the top of FIG. 1. The programmable interconnect element (INT 1311) may also include connections via routing conductor segments to and from a corresponding interconnect element that span multiple columns of logic. That is, routing conductor segments may span a plurality of tiles (e.g., a "hex" line spans six tiles).

For example, a CLB 1302 can include a configurable logic element (CLE 1312) that can be programmed to implement user logic plus a single programmable interconnect element (INT 1311). In an embodiment, the CLE 1312 includes four slices (not shown) of logic. A BRAM 1303 can include a BRAM logic element (BRL 1313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 1306 can include a DSP logic element (DSPL 1314) in addition to an appropriate number of programmable interconnect elements. An IOB 1304 can include, for example, two instances of an input/output logic element (IOL 1315) in addition to one instance of the programmable interconnect element (INT 1311). As will be clear to those of skill in the art, the actual I/O pads connected, for example, to the I/O logic element 1315 are manufactured using metal layered above the various illustrated logic blocks, and typically are not confined to the area of the input/output logic element 1315.

In the pictured embodiment, a columnar area near the center of the die (shown shaded in FIG. 13) is used for configuration, clock, and other control logic. Horizontal areas 1309 extending from this column are used to distribute the clocks and configuration signals across the breadth of the FPGA.

Some FPGAs utilizing the architecture illustrated in FIG. 13 include additional logic blocks that disrupt the regular columnar structure making up a large part of the FPGA. The additional logic blocks can be programmable blocks and/or dedicated logic. For example, the processor block PROC 1310 shown in FIG. 13 spans several columns of CLBs and BRAMs.

Note that FIG. 13 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 13 are purely exemplary. For example, in an actual FPGA, more than one adjacent column of CLBs is typically included wherever the CLBs appear, to facilitate the efficient implementation of user logic. Examples of FPGAs that may be used with embodiments of the invention are the Virtex 4 FPGAs available from Xilinx, Inc., of San Jose, Calif.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

We claim:

1. A computer-implemented method of designing an embedded system for a programmable integrated circuit (IC) based on a base platform having a processor and a configurable number of processing elements, the method comprising:
    obtaining parameters specific to the embedded system;
    generating source code files that use the parameters to define configurable attributes of the base platform;
    obtaining a software definition and a hardware definition each using an application programming interface (API) of the base platform to define communication between software and hardware of the embedded system;
    the software definition including software source code to be produced into code for execution by the processor of the base platform, the hardware definition including at least one logic block for implementation using the processing elements;
    wherein the source code files include instructions to be produced into code for execution by the processor including auxiliary instructions designating tasks to be performed by the processing elements;
    wherein the parameters specify a number of processing elements to include in the base platform, the instructions that designate the tasks to be performed by one or more of processing elements, and for each of the processing elements each of the instructions the processing element is capable of performing; and
    automatically building, using a computer, an implementation of the embedded system for the programmable IC using the source code files, the software definition, and the hardware definition;
    wherein the implementation includes:
        the auxiliary instructions that are executable by the processor, each auxiliary instruction indicating to the processor to send the auxiliary instruction to the processing elements for performing the designated task; and
        a lookup table configured to indicate for each auxiliary instruction that designates a task capable of being performed by more than one of the processing elements, the more than one of the processing elements sorted based on a cost function.

2. The method of claim 1, wherein the parameters include a selected number of the processing elements and instructions supported by the selected number of the processing elements.

3. The method of claim 2, wherein the source code files include at least one software header file and at least one hardware description language (HDL) source file, and wherein the hardware definition comprises HDL source code that describes a logic block for each of the selected number of processing elements.

4. The method of claim 3, wherein the step of automatically building comprises:
    generating an executable software file from the software source code, the at least one header file, and a software specification description for the base platform; and
    generating a hardware implementation from the HDL source file, the HDL source code, and a hardware specification description for the base platform.

5. The method of claim 4, wherein the step of generating the executable comprises:
    compiling the software source code to produce at least one object file;
    generating at least one library from the software specification description; and
    linking the at least one object file and the at least one library to produce the executable software file.

6. The method of claim 4, wherein the step of generating the hardware implementation comprises:
    generating a top-level HDL design file from the hardware specification description;
    synthesizing the top-level HDL design file, the HDL source file, and the HDL source code to produce at least one logical network list; and
    processing the at least one logical network list using implementation tools for the programmable IC to produce the hardware implementation.

7. The method of claim 4, wherein the software specification description of the hardware specification description is independent of the embedded system.

8. An apparatus for designing an embedded system for a programmable integrated circuit (IC) based on a base platform having a processor and a configurable number of processing elements, comprising:
    means for obtaining parameters specific to the embedded system;
    means for generating source code files that use the parameters to define configurable attributes of the base platform;
    means for obtaining a software definition and a hardware definition each using an application programming interface (API) of the base platform to define communication between software and hardware of the embedded system;

the software definition including software source code to be produced into code for execution by the processor of the base platform, the hardware definition including at least one logic block for implementation using the processing elements;

wherein the source code files include instructions to be produced into code for execution by the processor including auxiliary instructions designating tasks to be performed by the processing elements;

wherein the parameters specify a number of processing elements to include in the base platform, the instructions that designate the tasks to be performed by one or more of processing elements, and for each of the processing elements each of the instructions the processing element is capable of performing; and means for automatically building an implementation of the embedded system for the programmable IC using the source code files, the software definition, and the hardware definition;

wherein the implementation includes:
the auxiliary instructions that are executable by the processor, each auxiliary instruction indicating to the processor to send the auxiliary instruction to the processing elements for performing the designated task; and
a lookup table configured to indicate for each auxiliary instruction that designates a task capable of being performed by more than one of the processing elements, the more than one of the processing elements sorted based on a cost function.

9. The apparatus of claim 8, wherein the parameters include a selected number of the processing elements and instructions supported by the selected number of the processing elements.

10. The apparatus of claim 9, wherein the source code files include at least one software header file and at least one hardware description language (HDL) source file, and wherein the hardware definition comprises HDL source code that describes a logic block for each of the selected number of processing elements.

11. The apparatus of claim 10, wherein the means for automatically building comprises:
means for generating an executable from the software source code, the at least one header file, and a software specification description for the base platform; and
means for generating a hardware implementation from the HDL source file, the HDL source code, and a hardware specification description for the base platform.

12. The apparatus of claim 11, wherein the means for generating the executable comprises:
a compiler configured to compile the software source code to produce at least one object file;
a library generator configured to generate at least one library from the software specification description; and
a linker configured to link the at least one object file and the at least one library to produce the executable.

13. The apparatus of claim 11, wherein the means for generating the hardware implementation comprises:
a platform generator configured to generate a top-level HDL design file from the hardware specification description;
a synthesizer configured to synthesize the top-level HDL design file, the HDL source file, and the HDL source code to produce at least one logical network list; and
implementation tools configured to process the at least one logical network list using implementation tools to produce the hardware implementation.

14. The apparatus of claim 11, wherein the software specification description of the hardware specification description is independent of the embedded system.

15. An article of manufacture, comprising:
a computer readable storage medium having stored thereon processor-executable instructions for making an embedded system for a programmable integrated circuit (IC) based on a base platform having a processor and a configurable number of processing elements, wherein execution of the instructions by a computer causes the computer to perform operations including:
obtaining parameters specific to the embedded system;
generating source code files that use the parameters to define configurable attributes of the base platform;
obtaining a software definition and a hardware definition each using an application programming interface (API) of the base platform to define communication between software and hardware of the embedded system;
the software definition including software source code to be produced into code for execution by the processor of the base platform, the hardware definition including at least one logic block for implementation using the processing elements;
wherein the source code files include instructions to be produced into code for execution by the processor and instructions designating tasks to be performed by the processing elements;
wherein the parameters specify a number of processing elements to include in the base platform, the instructions that designate the tasks to be performed by one or more of processing elements, and for each of the processing elements each of the instructions the processing element is capable of performing; and
automatically building an implementation of the embedded system for the programmable IC using the source code files, the software definition, and the hardware definition;
wherein the implementation includes:
the auxiliary instructions that are executable by the processor, each auxiliary instruction indicating to the processor to send the auxiliary instruction to the processing elements for performing the designated task; and
a lookup table configured to indicate for each auxiliary instruction that designates a task capable of being performed by more than one of the processing elements, the more than one of the processing elements sorted based on a cost function.

16. The article of manufacture of claim 15, wherein the parameters include a selected number of the processing elements and instructions supported by the selected number of the processing elements.

17. The article of manufacture of claim 16, wherein the source code files include at least one software header file and at least one hardware description language (HDL) source file, and wherein the hardware definition comprises HDL source code that describes a logic block for each of the selected number of processing elements.

18. The article of manufacture of claim 17, wherein the operation of automatically building comprises:
generating an executable from the software source code, the at least one header file, and a software specification description for the base platform; and
generating a hardware implementation from the HDL source file, the HDL source code, and a hardware specification description for the base platform.

19. The article of manufacture claim 18, wherein the operation of generating the executable comprises:
- compiling the software source code to produce at least one object file;
- generating at least one library from the software specification description; and
- linking the at least one object file and the at least one library to produce the executable.

20. The article of manufacture of claim 18, wherein the code for generating the hardware implementation comprises:
- generating a top-level HDL design file from the hardware specification description;
- synthesizing the top-level HDL design file, the HDL source file, and the HDL source code to produce at least one logical network list; and
- processing the at least one logical network list using implementation tools for the programmable IC to produce the hardware implementation.

\* \* \* \* \*